(12) United States Patent
Kawachi et al.

(10) Patent No.: US 7,501,824 B2
(45) Date of Patent: Mar. 10, 2009

(54) MAGNETIC RESONANCE IMAGING APPARATUS AND METHOD OF CONVEYING THE MAGNETIC RESONANCE IMAGING APPARATUS

(75) Inventors: Hisashi Kawachi, Tokyo (JP); Norifumi Ohgishi, Tokyo (JP); Nobutaka Ito, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 55 days.

(21) Appl. No.: 11/763,098

(22) Filed: Jun. 14, 2007

(65) Prior Publication Data
US 2007/0290687 A1 Dec. 20, 2007

(30) Foreign Application Priority Data
Jun. 16, 2006 (JP) .............................. 2006-167392

(51) Int. Cl.
*G01V 3/00* (2006.01)
*H01Q 1/42* (2006.01)
*H01Q 1/36* (2006.01)

(52) U.S. Cl. .................... 324/318; 343/872; 343/896
(58) Field of Classification Search ......... 324/300–322; 600/410–435; 333/219–235; 343/703, 720, 343/872–875, 896
See application file for complete search history.

(56) References Cited
U.S. PATENT DOCUMENTS

| 3,794,959 | A | * | 2/1974 | Kamolz | 439/471 |
|---|---|---|---|---|---|
| 4,675,781 | A | * | 6/1987 | Saurenman | 361/216 |
| 5,065,760 | A | * | 11/1991 | Krause et al. | 600/421 |
| 5,239,265 | A | * | 8/1993 | Sugahara | 324/309 |
| 5,432,544 | A | | 7/1995 | Ziarati | |
| 5,464,014 | A | * | 11/1995 | Sugahara | 600/411 |
| 5,966,994 | A | * | 10/1999 | Woo | 74/513 |
| 6,229,311 | B1 | * | 5/2001 | Abenaim | 324/322 |
| 6,440,072 | B1 | * | 8/2002 | Schuman et al. | 600/437 |
| 6,611,702 | B2 | * | 8/2003 | Rohling et al. | 600/415 |
| 7,159,700 | B2 | * | 1/2007 | Liao | 191/12.4 |
| 7,365,541 | B2 | * | 4/2008 | Kojima | 324/318 |
| 2005/0178633 | A1 | * | 8/2005 | Liao | 191/12.4 |

FOREIGN PATENT DOCUMENTS

JP 2003190112 A 7/2003

* cited by examiner

*Primary Examiner*—Dixomara Vargas
(74) *Attorney, Agent, or Firm*—Armstrong Teasdale LLP

(57) ABSTRACT

With a view to shortening the cable laying time there is provided a magnetic resonance imaging apparatus for generating an image of a subject in accordance with a magnetic resonance signal received after application of a high-frequency magnetic field to the subject under a static magnetic field and a gradient magnetic field, the magnetic resonance imaging apparatus comprising a base, operating portions provided in the base and performing predetermined operations, such as a data collector and a controller, two pipes projecting from the base, and plural cables wound in the figure of 8 onto projecting portions of the two pipes projecting from the base, one end of the cables being connected electrically to the operating portions.

20 Claims, 4 Drawing Sheets

MAGNETIC RESONANCE IMAGING APPARATUS AND METHOD OF CONVEYING THE MAGNETIC RESONANCE IMAGING APPARATUS

CROSS REFERENCE TO RELATED APPLICATIONS

This application claims the benefit of Japanese Application No. 2006-167392 filed Jun. 16, 2006.

BACKGROUND OF THE INVENTION

The present invention relates to a magnetic resonance imaging apparatus and a method of conveying the magnetic resonance imaging apparatus.

In a magnetic resonance imaging apparatus, a magnet section for applying a magnetic field to a subject and receiving a magnetic resonance signal from the subject is disposed in a magnet room and an operation console for controlling the operation of the magnet section is disposed in an operation room (see, for example, Patent Literature 1). The magnet section and the operation console are connected together through plural (for example, ten or more) cables.

At the time of shipping of the magnetic resonance imaging apparatus, the plural cables are conveyed separately from the magnet section in a state in which the cables are wound like coils in the same direction, and are unwound at the site where the magnetic resonance imaging apparatus is to be installed. Then, the cables are connected to the magnet section and are accommodated within a pit or duct communicating with the magnet room and the operation room. A required length of the cables varies depending on environmental conditions in the place of installation of the magnetic resonance apparatus such as the size of the magnet room. Therefore, the length of the cables is set with a margin and there occur surplus portions of the cables after installation of the magnetic resonance apparatus. The surplus portions of the cables are bundled in the figure of 8 for the reduction of noise.

[Patent Literature 1] Japanese Unexamined Patent Publication No. 2003-190112

In such a wiring method as described above it is necessary to perform a work of winding the surplus portions of the plural cables in the figure of 8 to adjust the length thereof and a work of connecting the cables to a unit. These works are an obstacle to shortening of the time required for installation of the magnetic resonance imaging apparatus, causing an increase of cost.

SUMMARY OF THE INVENTION

It is desirable that the problem described previously is solved.

In a first aspect of the invention, there is provided a magnetic resonance imaging apparatus for generating an image of a subject in accordance with a magnetic resonance signal received after application of a magnetic field to the subject, the magnetic resonance imaging apparatus comprising a base, an operating portion provided in the base and performing a predetermined operation, two rod-like members projecting from the base, and a plurality of cables entrained in the figure of 8 on projecting portions of the two rod-like members projecting from the base, one ends of the cables being connected electrically to the operating portion.

Preferably, the operating portion performs an operation associated with at least one of conveyance of the subject, generation of the magnetic field, reception of the magnetic resonance signal, and communication with the subject.

Preferably, the magnetic resonance imaging apparatus further comprises: a cradle for resting the subject thereon; and a magnet section having an imaging space permitting the cradle to be loaded therein, the magnet section generating the magnetic field within the imaging space and capable of receiving the magnetic resonance signal from the subject, and the base can be conveyed separately from the magnetic section.

Preferably, the base is disposed in an end portion of the magnet section in a loading/unloading direction of the cradle with respect to the imaging space and comprises an upper structure portion constituting a part of a conveyance path which supports the cradle movably and a lower structure portion supporting the upper structure portion and having a width in a direction orthogonal to the loading/unloading direction of the cradle with respect to the imaging space which width is narrower than the width of the upper structure portion, the two rod-like members project from a side face of the lower structure portion which side face extends in the loading/unloading direction of the cradle, and the plural cables are entrained on projecting portions of the two rod-like members projecting from the side face.

Preferably, the base is disposed in the magnet section on the side opposite to an inlet/outside side of the cradle with respect to the imaging space.

Preferably, the base has a first plate member and a second plate member, the first plate member and the second plate member being opposed to each other and constituting both side faces extending in the loading/unloading direction of the cradle, the first plate member having two first holes for insertion therein of the two rod-like members respectively, the second plate member having two second holes for insertion therein of the two rod-like members respectively, the two rod-like members are inserted into the first and second holes and are thereby mounted bridgewise in the first and second plate members, and the plural cables are entrained on projecting portions of the two rod-like members projecting from the first plate member.

Preferably, the first holes are positioned higher than the second holes.

The two rod-like members are respectively formed with engaging grooves for fitting therein of lower edge portions of the first holes in the first plate member and engaging grooves for fitting therein of upper edge portions of the second holes in the second plate member.

In a second aspect of the invention, there is provided a magnetic resonance imaging apparatus for generating an image of a subject in accordance with a magnetic resonance signal after application of a magnetic field to the subject, the magnetic resonance imaging apparatus comprising: a base; an operating portion provided in the base and performing a predetermined operation; and two rod-like members projecting from the base and permitting a plurality of cables to be entrained thereon in the figure of 8, one ends of the cables being connected electrically to the operating portion.

In a third aspect of the invention, there is provided a magnetic resonance imaging apparatus for generating an image of a subject in accordance with a magnetic resonance signal received after application of a magnetic field to the subject, the magnetic resonance imaging apparatus comprising: a cradle for resting the subject thereon; a magnet section having an imaging space permitting the cradle to be loaded therein, the magnet section generating the magnetic field within the imaging space and capable of receiving the magnetic resonance signal from the subject; a base disposed in an end portion of the magnet section in a loading/unloading direction of the cradle with respect to the imaging space and capable of being conveyed separately from the magnet section; an operating section provided in the base and performing a predetermined operation; and a plurality of cables electrically connected at one ends thereof to the operating section, the base comprising an upper structure portion constituting a part of a conveyance path which supports the cradle movably and a lower structure portion supporting the upper structure portion and having a width in a direction orthogonal to the loading/unloading direction of the cradle with respect to the imaging space which width is narrower than the width of the upper structure portion, the lower structure portion having a first plate member and a second plate member, the first plate member and the second plate member being opposed to each other and constituting both sides extending in the loading/unloading direction of the cradle, the first plate member having two first holes for insertion therein of two rod-like members respectively, the second plate member having two second holes for insertion therein of the two rod-like members respectively, the first and second holes being formed so that the two rod-like members which permit a plurality of cables to be entrained thereon can be mounted bridgewise in the first and second plate members, the first holes being positioned higher than the second holes.

In a fourth aspect of the invention, there is provided a method of conveying a magnetic resonance imaging apparatus, comprising the step of conveying a unit, in a state in which a plurality of cables bundled in the figure of 8 are held by the unit constituting a part of the magnetic resonance imaging apparatus which generates an image of a subject in accordance with a magnetic resonance signal received after application of a magnetic field to the subject, and one ends of the plural cables are connected to the unit.

EFFECT OF THE INVENTION

According to the invention it is possible to provide a magnetic resonance imaging apparatus and a magnetic resonance imaging apparatus conveying method both permitting reduction of the cable laying time.

Further objects and advantages of the present invention will be apparent from the following description of the preferred embodiments of the invention as illustrated in the accompanying drawings.

DETAILED DESCRIPTION OF THE INVENTION

Figure 1:
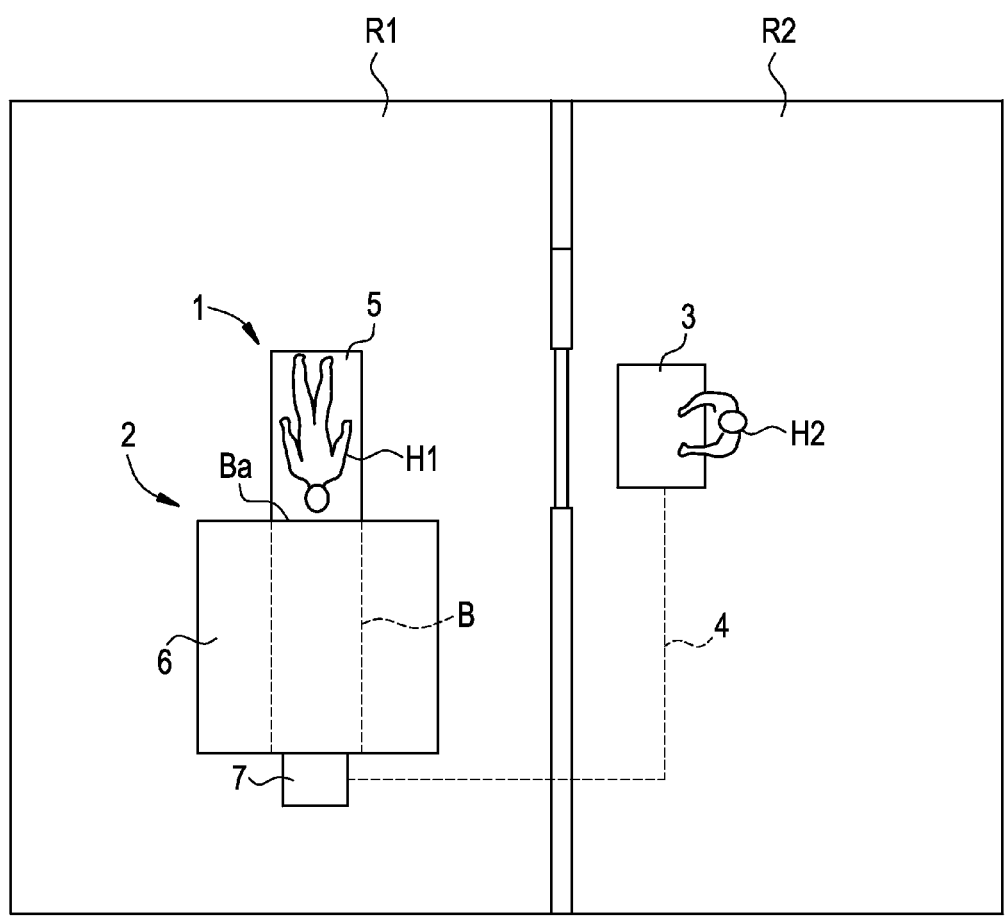
FIG. 1 is a plan view showing schematically the construction and layout of a magnetic resonance imaging apparatus according to an embodiment of the invention.

FIG. 1 is a plan view showing schematically the construction and layout of a magnetic resonance imaging apparatus (MRI apparatus) according to an embodiment of the invention.

The MRI apparatus, indicated at 1, includes a body 2 disposed in a scan room R1 to pick up an image of a subject H1, an operation console 3 disposed in an operation room R2 and accepting operation of an operator H2 for the MRI apparatus, and plural cables 4 (e.g., ten or more, only one is shown in FIG. 1) for connecting the body 2 and the operation console 3 with each other.

The scan room R1 is constructed so as to prevent the entry of radiation electromagnetic wave leaking from the body 2 and disturbance electromagnetic wave. The plural cables 4 extend from the scan room R1 to the operation room R2 through a pit or duct.

The body 2 includes a cradle 5 for conveyance of the subject H1, a magnet section 6 for application of a magnetic field to the subject H1 and for reception of a magnetic resonance signal from the subject, and a pedestal 7 for driving the cradle 5 and for input and output of signals to and from the magnet section 6.

The cradle 5 has a size permitting the subject H1 to lie down thereon and is supported movably by a support portion 8 (see FIG. 3). The magnet section 6 has an imaging space (bore) B which permits the cradle 5 to be loaded therein. The cradle 5 is loaded into and unloaded from the imaging space B through an inlet/outlet Ba in a body axis direction (vertical direction of the paper surface in FIG. 1) as a loading/unloading direction. The pedestal 7 is disposed on the side opposite to the inlet/outlet Ba with respect to the magnet portion 6. At least part of the plural cables 4 are connected to the pedestal 7.

Figure 2:
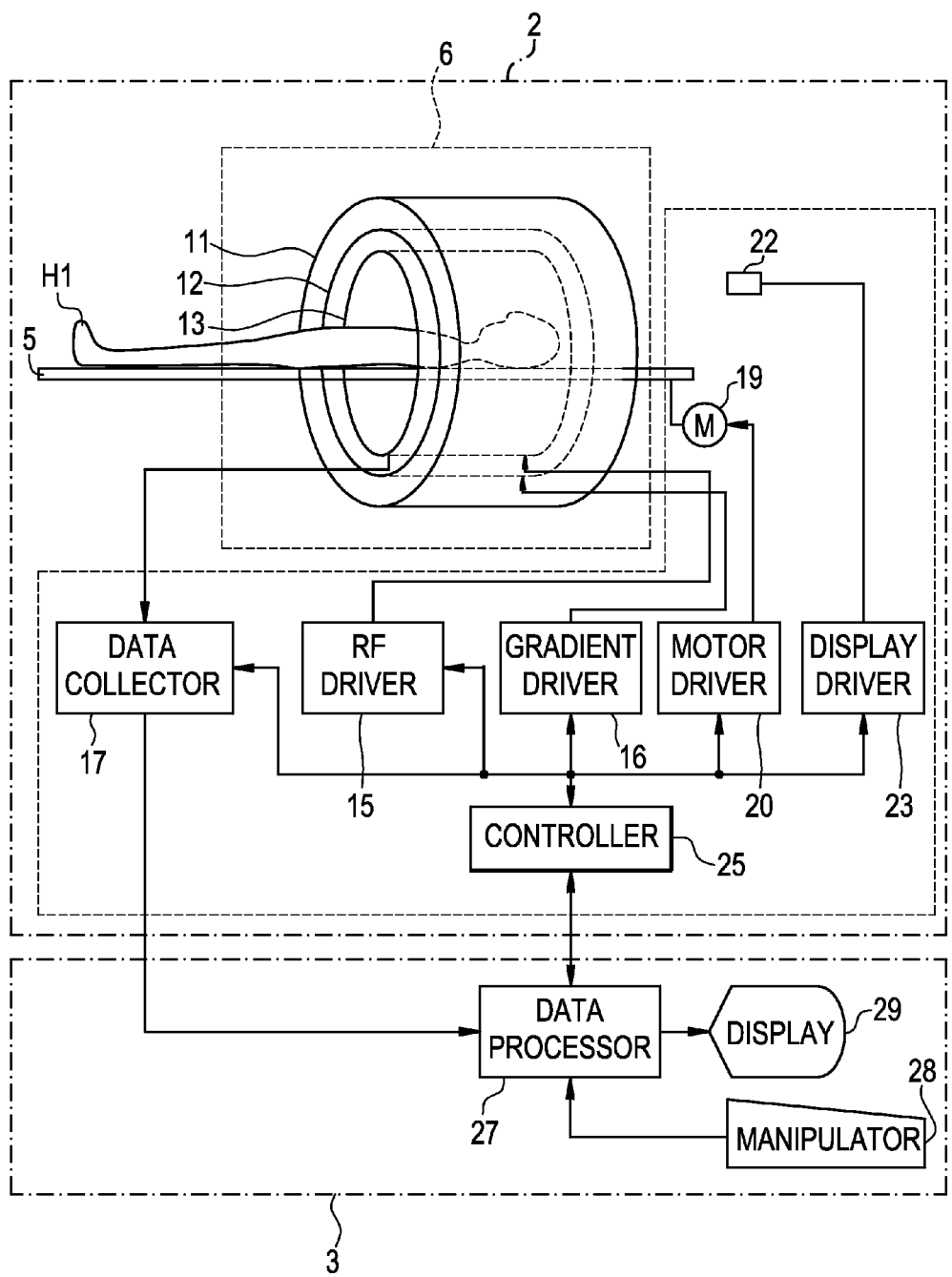
FIG. 2 is a block diagram showing schematically the construction of a signal processing system in the magnetic resonance imaging apparatus of FIG. 1.

FIG. 2 is a block diagram showing the construction of a signal processing system in the MRI apparatus 1.

The magnet section 6 includes a static magnetic field-forming magnet 11, a gradient coil 12 and an RF coil 13.

The static magnetic field-forming magnet 11 is provided for forming a static magnetic field in the imaging space B in which the subject is accommodated. The static magnetic field-forming magnet 11 is constituted, for example, by a pair of permanent magnets in such a manner that the direction of the static magnetic field runs along the body axis direction of the subject H1 or a direction perpendicular to the body axis. The static magnetic field-forming magnet 11 may be constituted by a superconducting magnet.

The gradient coil 12 forms a gradient magnetic field in the imaging space B with a static magnetic field formed therein and adds positional information to a magnetic resonance signal which the RF coil 13 receives. The gradient coil 12 includes three coil systems which are a first gradient coil for forming a frequency encoding gradient magnetic field, a second gradient coil for forming a phase encoding gradient magnetic field and a third gradient coil for forming a slice selecting gradient magnetic field.

Within the imaging space B in which a static magnetic field is formed by the static magnetic field-forming magnet 11, the RF coil 13 transmits RF pulses as an electromagnetic wave to the subject H1 to form a high-frequency magnetic field, thereby exciting spin of a proton in an imaging area of the subject. Further, the RF coil 13 receives and outputs an electromagnetic wave generated from the excited proton in the subject H1 as a magnetic resonance signal. For example, the RF coil 13 is constituted by a surface coil disposed on a body surface of the subject H1.

The pedestal 7 is provided with an RF driver 15, a gradient driver 16 and a data collector 17, to perform processings related to the generation of a magnetic field and the reception of a magnetic resonance signal in the magnet section 6. The pedestal 7 is also provided with a motor 19 and a motor driver 20 to perform processings related conveyance of the cradle 5, further provided with a display 22 and a display driver 23 to perform processings related to communication with the subject H1, and a controller 25 to control the operations of these operating portions. Part of them may be provided in the magnet section 6.

The RF driver 15 outputs to the RF coil 13 a drive signal for driving the RF coil 13 to form a high-frequency magnetic field within the imaging space B. More specifically, the RF driver 15 includes a gate modulator (not shown), an RF power amplifier (not shown) and an RF oscillator (not shown). In accordance with a control signal provided from the controller 25 and with use of a gate modulator, the RF driver 15 modulates an RF signal provided from the RF oscillator into a signal of a predetermined envelope with a predetermined timing. The RF signal thus modulated by the gate modulator is then amplified by the RF power amplifier, followed by output to the RF coil 13.

In accordance with a control signal provided from the controller 25 the gradient driver 16 applies gradient pulses to the gradient coil 12 to energize the same coil, thereby causing the coil to generate a gradient magnetic field within the imaging space B in which a static magnetic field is formed. The gradient driver 16 has three systems of drive circuits (not shown) correspondingly to the three systems of gradient coils 12.

In accordance with a control signal provided from the controller 25, the data collector 17 collects and outputs the magnetic resonance signal which the RF coil 13 receives. The data collector 17 collects a phase- and frequency-encoded magnetic resonance signal so as to correspond to k space. After the phase of the magnetic resonance signal which the RF coil 13 receives is detected by a phase detector using as a reference signal the output of the RF oscillator in the RF driver 15, the data collector 17 converts the magnetic resonance signal of that analog signal into a digital signal with use of an A/D converter. The magnetic resonance signal thus collected is stored in memory and is then outputted.

The motor 19 is constituted for example by a stepping motor or a servo motor and the rotation thereof is transmitted to the cradle 5 via a transfer mechanism (not shown) including gears and belt. As a result there are performed loading and unloading of the cradle 5 with respect to the imaging space B. The motor driver 20 outputs to the motor 19 a drive current proportional to a control signal provided from the controller 25, thereby driving the motor 19.

The display 22 is constituted for example by a liquid crystal display. The display driver 23 outputs to the display 22 a video signal proportional to a control signal provided from the controller 25, causing the display 22 to display appropriate information. As means associated with communication, the pedestal 7 may be provided with a speaker or microphone for voice communication.

The controller 25 is constituted by a computer for example. In accordance with a control signal inputted from the operation console 3 the controller 25 outputs a control signal to each of RF driver 15, gradient driver 16, data collector 17, motor driver 20 and display driver 23.

The operation console 3 includes a data processor 27, a manipulator 28 and a display 29.

The manipulator 28 is constituted by manipulating devices such as, for example, a keyboard and a mouse and outputs a signal responsive to an operation. The display 29 is constituted by a liquid crystal display for example and displays an image responsive to an inputted video signal.

The data processor 27 is constituted by a computer for example and outputs to the controller 25 a control signal responsive to a signal outputted from the manipulator 28. The data processor 27 acquires the magnetic resonance signal collected by the data collector 17, then performs an image processing for the acquired magnetic resonance signal to generate an image on slicing of the subject, and outputs a video signal of the generated image to the display 29.

Among the plural cables 4 shown in FIG. 1 there are included, for example, a cable for connection between the controller 25 and the data collector 27 and a cable for connection between the data collector 17 and the data processor 27.

Figure 3A:
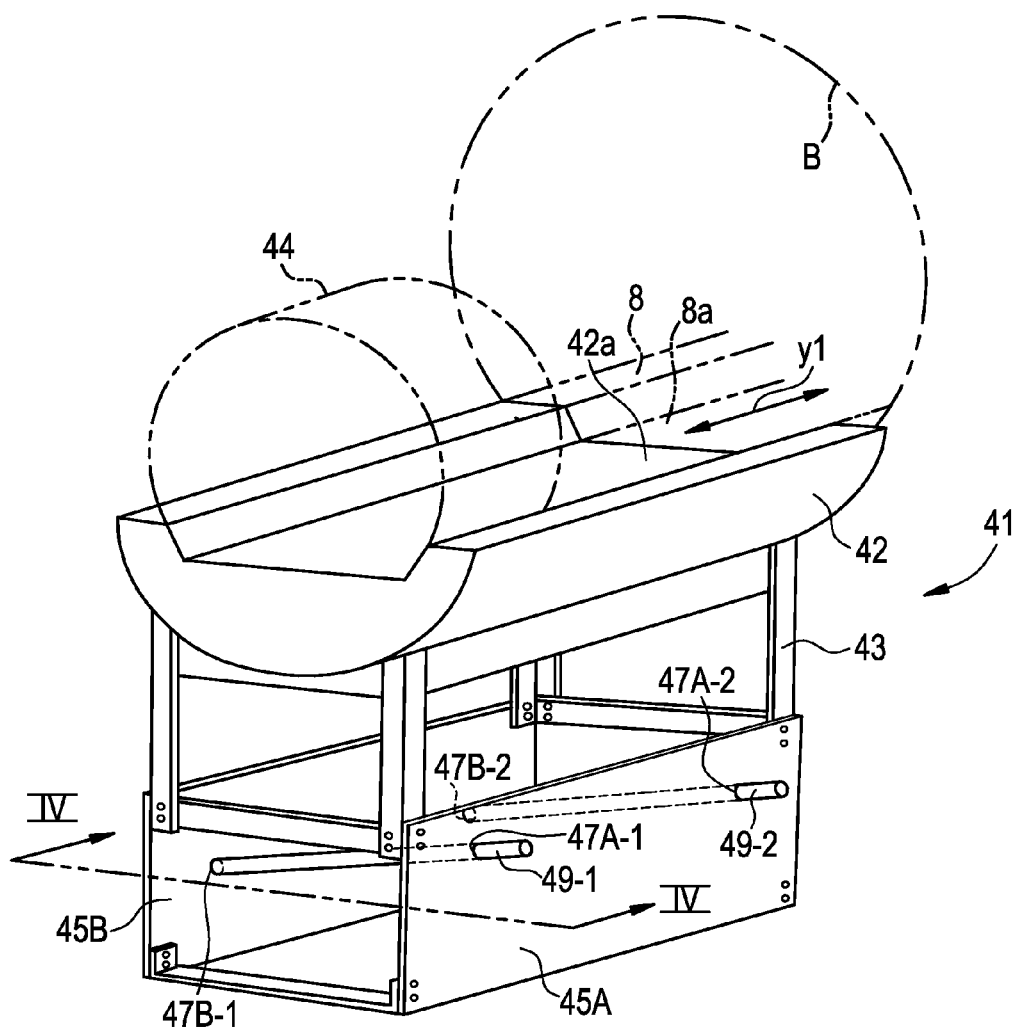
FIGS. 3(*a*) and 3(*b*) illustrate a pedestal used in the magnetic resonance imaging apparatus of FIG. 1.

FIG. 3(a) is a perspective view showing an outline of a base 41 of the pedestal 7. FIG. 3(a) shows a state in which pipes 49-1 and 49-2 (hereinafter referred to simply as "pipes 49," with no distinction made between the two, as the case may be) to be utilized at the time of shipping of the pedestal 7 are secured to the base 41.

Operating portions such as RF driver 15, gradient driver 16, data collector 17, motor 19, motor driver 20, display 22, display driver 23 and controller 25 are mounted to the base 41. It is optional whether these operating portions are to be provided inside or outside the base 41.

The base 41 is formed of a non-magnetic material such as stainless steel. The base 41 includes an upper structure portion 42 and a lower structure portion 43 which supports the upper structure portion, the upper structure portion 42 constituting an end portion of the support portion 8 on the side opposite to the inlet/outlet Ba (FIG. 1) of the imaging space B, the support portion 8 supporting the cradle 5 movably.

The upper structure portion 42 has a carrier surface 42a for resting the cradle 5 thereon, the carrier surface 42a constituting a part of a conveyance path 8a which supports the cradle 5 movably. For example, wheels are mounted on the underside of the cradle 5 and rotate along the conveyance path 8a including the carrier surface 42a, whereby the cradle 5 can move on the conveyance path 8a. A movable portion 44 is provided on the carrier surface 42a. The movable portion 44 is fixed to the cradle 5 and moves on the carrier surface 42a with a driving force transmitted thereto from the motor 19. The display 22 is provided in the movable portion 44.

The lower structure portion 43 is constituted by a combination of a frame structure and a wall structure. The lower structure portion 43, on its lower side constituted by the wall structure, is provided with a first plate member 45A and a second plate member 45B (both hereinafter referred to simply as "plate members 45," with no distinction made between the two, as the case may be) which constitute both side faces in the loading/unloading direction of the cradle 5. The width of the lower structure member 43 in a direction orthogonal to the loading/unloading direction (indicated by arrow y1) of the cradle 5, i.e., the distance between the first and second plate members 45A, 45B, is set narrower than the width of the upper structure portion 42.

First holes 47A-1 and 47A-2 (hereinafter referred to simply as "first holes 47A," with no distinction made between the two, as the case may be) are formed in the first plate member 45A, while second holes 47B-1 and 47B-2 (hereinafter referred to simply as "second holes 47B," with no distinction made between the two, as the case may be) are formed in the second plate member 45B. The first and second holes 47A, 47B may hereinafter be referred to simply as "holes 47" without making distinction between the two.

The pipe 49-1 is inserted through the first hole 47A-1 and the second hole 47B-1, while the pipe 49-2 is inserted through the first hole 47A-2 and the second hole 47B-2. The pipes 49 project outwards from the first plate member 45A through the first holes 47A and the plural cables 4 can be wound round the projecting portions of the pipes.

Figure 3B:
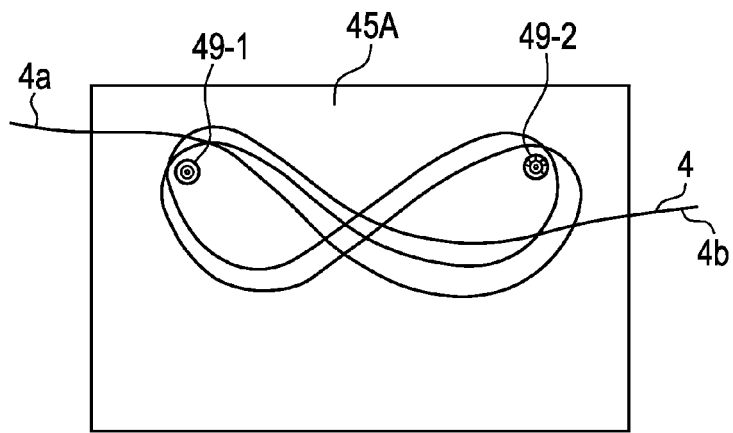

FIG. 3(b) shows a state in which the plural cables 4 are wound onto the pipes 49, provided only one of the cables 4 is shown in the same figure. The plural cables 4 assume the illustrated state at the time of shipping of the pedestal 7.

The cables 4 are wound alternately in opposite directions, i.e., wound in the figure of 8, with respect to the two pipes 49. One ends 4a of the cables 4 are connected through a connector or the like to various components including data collector 17 and controller 25 which are mounted to the base 41. Opposite ends 4b are to be connected to the operation console 3 through a connector or the like.

Figure 4:
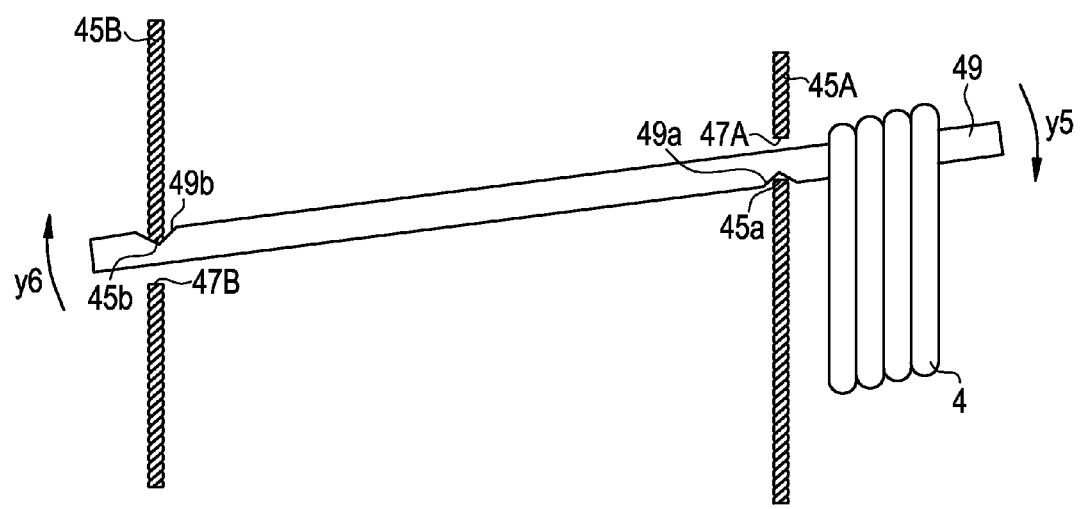
FIG. 4 is a sectional view taken on line IV-IV in FIG. 3.

FIG. 4 is a sectional view showing the plate members 45 and the pipes 49 in the arrowed direction IV-IV in FIG. 3.

The first holes 47A are positioned higher than the second holes 47B. Thus, the pipes 49 are mounted bridgewise in the first plate member 45A and the second plate member 45B so that the first plate member 45A side, i.e., the side where the cables 4 are entrained on the pipes, is the higher.

The pipes are formed with engaging grooves 49a for fitting therein of lower edge portions 45a which form the first holes 47A of the first plate member 45A and engaging grooves 49b for fitting therein of upper edge portions 45b which form the second holes 47B of the second plate member 45B.

In a state in which the plural cables 4 are not entrained on the pipes 49, the pipes are established their position in the longitudinal direction by mutual engagement of the edge portions 45a and the engaging grooves 49a. In a state in which the plural cables 4 are entrained on the pipes 49, as indicated by arrows y5 and y6, the pipes 49 turn with the engaging grooves 49a and edge portions 45a as fulcrums under the load of the plural cables 4 in such a manner that the first plate member 45A side is displaced upward and the second plate member 45B side is displaced downward, and the edge portions 45b and the engaging grooves 49b come into engagement with each other. Thus, the pipes 49 are established their position in their longitudinal direction by not only the edge portions 45a and engaging grooves 49a but also the edge portions 45b and engaging grooves 49b.

Shipping of the MRI apparatus 1 described above is performed in the following manner.

The cradle 5 and the magnet section 6 are conveyed separately from the pedestal 7. During shipment, the pedestal 7 is in a state such that components finally installed in the pedestal 7 such as RF driver 15, gradient driver 16, data collector 17, motor 19, motor driver 20, display 22, display driver 23, controller 25, movable portion 44 and a transfer mechanism (not shown) for transferring the rotation of the motor 19 to the movable portion 44 are mounted to the base 41. However, according to various circumstances, a portion of these components may be conveyed separately from the base 41. One ends 4a of the plural cables 4 are connected to various components provided in the pedestal 7, including data collector 17 and controller 25, and are wound in the figure of 8 onto the pipes 49.

When the pedestal 7 is conveyed to the scan room R1, it is installed so that its positional relation to the magnet section 6 is fixed. Using a fixing member, e.g., bolts, the pedestal 7 is fixed to the magnet section 6 or to the floor surface of the scan room R1. The other ends 4b of the plural cables 4 are connected to the operation console 3 installed in the operation room R2. At this time, the plural cables 4 are unwound in an amount necessary for wiring successively from the pipes 49 and are stretched. Surplus portions of the cables 4 are bundled with a tape or the like, then are taken off from the pipes 49 while retaining the figure of 8 for example by being pulled out from the pipes, and are accommodated into a pit or the like. Thereafter, the pipes 49 are pulled out from the plate members 45 and are disposed of.

According to the above embodiment, during shipment, the MRI apparatus 1 is equipped with the base 41, the data collector 17 and other operating portions provided in the base 41, the two pipes 49 projecting from the base 41, and plural cables 4 entrained in the figure of 8 on the two pipes 49 and with their one ends 4a connected electrically to the operating portions. Therefore, at the time of installation, the work of connecting the plural cables 4 to the operating portions and the work of winding the surplus portions of the plural cables 4 in the figure of 8 are omitted and hence the cable laying time for the plural cables 4 can be shortened. Besides, there is no fear of the plural cables 4 being twisted when unwound in the figure of 8 from a unidirectionally coiled state.

The base 41 can be fixed to and separated from the magnet section 6. That is, the pedestal 7 can be conveyed separately from the magnet section 6 and even with the plural cables 4 connected thereto, it is relatively compact and the conveyance thereof is easy.

The base 41 has the upper structure portion 42 which supports the cradle 5 and the lower structure portion 43 which supports the upper structure portion 42 and whose width is smaller than that of the upper structure portion 42, and the plural cables 4 are entrained on the projecting portions of the pipes 49 projecting from a side face of the lower structure portion 43. Therefore, an increase in width of the entire pedestal 7 during conveyance caused by such a sideways disposal of the plural cables 4 is restrained.

The pedestal 7 is disposed in the magnet section 6 on the side opposite to the inlet/outlet Ba in the imaging space B for the cradle 5, so even if the appearance of the MRI apparatus 1 is spoiled by the holes 47 with the pipes 49 inserted therein, no influence is exerted on the portion apt to catch the eyes of the subject H1, in other words, a conspicuous portion of the MRI apparatus 1.

Since the means for mounting the plural cables 4 thereon is constituted by the pipes 49 inserted through the holes 47, the construction thereof is simple; besides, unnecessary projections can be removed by pulling out the pipes 49 after installation. Further, since the plate members 45 function also as walls of the wall structure, it is also possible to attain the reduction in size of the base 41 while ensuring the required strength of the base 41.

Since the first holes 47A formed in the first plate member 45A are positioned higher than the second holes 47B formed in the second plate member 45B and the pipes 49 are higher on the side where the plural cables 4 are mounted thereon, the plural cables 4 can be prevented from falling off from the tips of the pipes 49 by virtue of their own weight for example.

Since the pipes 49 are formed with engaging grooves 49a for fitting therein of the lower edge portions 45a which form the first holes 47A of the first plate member 45A and engaging grooves 49b for fitting therein of the upper edge portions 45b which form the second holes 47B of the second plate member 45B, the pipes 49 can be established their position in their longitudinal direction with such a simple construction.

In the MRI apparatus 1 of the above embodiment, the state in which the plural cables 4 are mounted in the figure of 8 on the pipes 49, the state in which the pipes 49 are inserted through the holes 47 of the plate members 45, but the plural cables 4 are not wound onto the pipes 49 (before winding or after their removal), and the state in which the holes 47 are provided to the plate members 45, but the pipes 49 are not inserted through the holes 47 of the plate members 45 (before insertion or after their removal), are all examples of the invention.

In the above embodiment, the data collector 17 and the controller 25 are examples of the operating portion in the invention, the pipes 49 are an example of the rod-like members in the invention, and the pedestal 7 is an example of the unit which constitutes a part of the magnetic resonance imaging apparatus of the invention.

The invention is not limited to the above embodiment, but may be practiced in various other modes.

The base in which the rod-like members are disposed is not limited to the base of the pedestal disposed on the side opposite to the inlet/outlet in the imaging space for the cradle insofar as the base constitutes a unit to which plural cables are connected. For example, the base in question may be a base of a unit provided on the inlet/outlet side in the imaging space, or a base of a unit provided sideways with respect to the cradle loading direction into the imaging space, or a base of the magnet section.

The operating portions include all of operating portions if only they perform operations associated with the generation of an image of the subject in the magnetic resonance imaging apparatus. No limitation is made to the operating portions performing conveyance of the cradle, generation of a magnetic field, reception of a magnetic resonance signal, and communication with the subject. For example, a lighting device for lighting the interior of the bore and a filter circuit for eliminating noises from collected data may also be included as operating portions.

The rod-like members are not limited to such hollow members as pipes insofar as they permit plural cables to be wound thereon. They may be solid ones. Whether rod-like members permit plural cables to be wound thereon or not can be determined mainly on the basis of their strength. For example, in the case where the load of the plural cables is imposed on the rod-like members as in the above embodiment, it is necessary for the rod-like members to have a strength such that they do not break under the load. In the case where the rod-like members are provided vertically and the load of the plural cables is not imposed thereon, it is necessary for the rod-like members to have a strength such that they do not break when winding the plural cables onto the rod-like members or when unwinding the cables from the rod-like members. Whether holes are for insertion therein of rod-like members which permit plural cables to be mounted thereon can be determined by estimating the strength of the rod-like members from the diameter of each hole.

The sectional shape of the rod-like members may be set suitably. For example, it may be rectangular. The sectional shape may vary in the longitudinal direction. In this case, for example by enlarging the diameter of each rod-like member on the side projecting from the base, it is possible to prevent dislodgment of the cables. The rod-like members may be curved or bent insofar as they have respective portions permitting cables to be wound thereon. An anti-dislodgment member or the like may be provided halfway. At least two rod-like members are required for winding the cables in the figure of 8, but three or more rod-like members may be used. In the case of using three or more rod-like members, for example by appropriately setting the spacing between two or more rod-like members associated with one circle of the two circles of the figure of 8 of the cables, it is possible to define the radius of the one circle. The spacing between two rod-like members and the direction thereof may be set suitably. For example, the spacing between two rod-like members may be set larger on their projecting side from the base, whereby it is possible to prevent dislodgment of the cables.

The method for mounting the rod-like members is not limited to the method of inserting them through the holes formed in the plate members. For example, ring portions which permit the rod-like members to be inserted therein may be formed in a base constituted by a frame structure. The rod-like members need not always be provided removably in the base, but may be fixed to the base.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus for generating an image of a subject in accordance with a magnetic resonance signal received after application of a magnetic field to the subject, the magnetic resonance imaging apparatus comprising:
   a magnet section configured to generate the magnetic field and to receive the magnetic resonance signal from a subject;
   a base;
   an operating portion provided in the base and performing a predetermined operation;
   two rod-like members projecting from the base; and
   a plurality of cables entrained in the figure of 8 on projecting portions of the two rod-like members projecting from the base, one ends of the cables being connected electrically to the operating portion.

2. A magnetic resonance imaging apparatus according to claim 1, wherein the operating portion performs an operation associated with at least one of conveyance of the subject, generation of the magnetic field, reception of the magnetic resonance signal, and communication with the subject.

3. A magnetic resonance imaging apparatus according to claim 2, further comprising:
   a cradle for resting the subject thereon, wherein the magnet section comprising an imaging space permitting the cradle to be loaded therein,
   wherein the base can be conveyed separately from the magnetic section.

4. A magnetic resonance imaging apparatus according to claim 3, wherein:
   the base has a first plate member and a second plate member, the first plate member and the second plate member being opposed to each other and constituting both side faces extending in the loading/unloading direction of the cradle;
   the first plate member has two first holes for insertion therein of the two rod-like members respectively;
   the second plate member has two second holes for insertion therein of the two rod-like members respectively;
   the two rod-like members are inserted into the first and second holes and are thereby mounted bridgewise in the first and second plate members; and
   the plural cables are entrained on projecting portions of the two rod-like members projecting from the first plate member.

5. A magnetic resonance imaging apparatus according to claim 3, wherein:
   the base is disposed in an end portion of the magnet section in a loading/unloading direction of the cradle with respect to the imaging space, and comprises: an upper structure portion constituting a part of a conveyance path which supports the cradle movably; and a lower structure portion supporting the upper structure portion and having a width in a direction orthogonal to the loading/unloading direction of the cradle with respect to the imaging space which width is narrower than the width of the upper structure portion;

the two rod-like members project from a side face of the lower structure portion which side face extends in the loading/unloading direction of the cradle; and the plural cables are entrained on projecting portions of the two rod-like members projecting from said side face.

6. A magnetic resonance imaging apparatus according to claim 5, wherein the base is disposed in the magnet section on the side opposite to an inlet/outlet side of the cradle with respect to the imaging space.

7. A magnetic resonance imaging apparatus according to claim 6, wherein:

the base has a first plate member and a second plate member, the first plate member and the second plate member being opposed to each other and constituting both side faces extending in the loading/unloading direction of the cradle;

the first plate member has two first holes for insertion therein of the two rod-like members respectively;

the second plate member has two second holes for insertion therein of the two rod-like members respectively;

the two rod-like members are inserted into the first and second holes and are thereby mounted bridgewise in the first and second plate members; and the plural cables are entrained on projecting portions of the two rod-like members projecting from the first plate member.

8. A magnetic resonance imaging apparatus according to claim 5, wherein:

the base has a first plate member and a second plate member, the first plate member and the second plate member being opposed to each other and constituting both side faces extending in the loading/unloading direction of the cradle;

the first plate member has two first holes for insertion therein of the two rod-like members respectively;

the second plate member has two second holes for insertion therein of the two rod-like members respectively;

the two rod-like members are inserted into the first and second holes and are thereby mounted bridgewise in the first and second plate members; and the plural cables are entrained on projecting portions of the two rod-like members projecting from the first plate member.

9. A magnetic resonance imaging apparatus according to claim 1, further comprising:

a cradle for resting the subject thereon, wherein the magnet section comprises an imaging space permitting the cradle to be loaded therein, wherein the base can be conveyed separately from the magnetic section.

10. A magnetic resonance imaging apparatus according to claim 9, wherein:

the base is disposed in an end portion of the magnet section in a loading/unloading direction of the cradle with respect to the imaging space, and comprises: an upper structure portion constituting a part of a conveyance path which supports the cradle movably; and a lower structure portion supporting the upper structure portion and having a width in a direction orthogonal to the loading/unloading direction of the cradle with respect to the imaging space which width is narrower than the width of the upper structure portion;

the two rod-like members project from a side face of the lower structure portion which side face extends in the loading/unloading direction of the cradle; and the plural cables are entrained on projecting portions of the two rod-like members projecting from said side face.

11. A magnetic resonance imaging apparatus according to claim 10, wherein the base is disposed in the magnet section on the side opposite to an inlet/outlet side of the cradle with respect to the imaging space.

12. A magnetic resonance imaging apparatus according to claim 11, wherein:

the base has a first plate member and a second plate member, the first plate member and the second plate member being opposed to each other and constituting both side faces extending in the loading/unloading direction of the cradle;

the first plate member has two first holes for insertion therein of the two rod-like members respectively;

the second plate member has two second holes for insertion therein of the two rod-like members respectively;

the two rod-like members are inserted into the first and second holes and are thereby mounted bridgewise in the first and second plate members; and the plural cables are entrained on projecting portions of the two rod-like members projecting from the first plate member.

13. A magnetic resonance imaging apparatus according to claim 10, wherein:

the base has a first plate member and a second plate member, the first plate member and the second plate member being opposed to each other and constituting both side faces extending in the loading/unloading direction of the cradle;

the first plate member has two first holes for insertion therein of the two rod-like members respectively;

the second plate member has two second holes for insertion therein of the two rod-like members respectively;

the two rod-like members are inserted into the first and second holes and are thereby mounted bridgewise in the first and second plate members; and the plural cables are entrained on projecting portions of the two rod-like members projecting from the first plate member.

14. A magnetic resonance imaging apparatus according to claim 9, wherein:

the base has a first plate member and a second plate member, the first plate member and the second plate member being opposed to each other and constituting both side faces extending in the loading/unloading direction of the cradle;

the first plate member has two first holes for insertion therein of the two rod-like members respectively;

the second plate member has two second holes for insertion therein of the two rod-like members respectively;

the two rod-like members are inserted into the first and second holes and are thereby mounted bridgewise in the first and second plate members; and the plural cables are entrained on projecting portions of the two rod-like members projecting from the first plate member.

15. A magnetic resonance imaging apparatus according to claim 9, wherein the two rod-like members are respectively formed with engaging grooves for fitting therein of lower edge portions of the first holes in the first plate member and engaging grooves for fitting therein of upper edge portions of the second holes in the second plate member.

16. A magnetic resonance imaging apparatus according to claim 14, wherein the first holes are positioned higher than the second holes.

17. A magnetic resonance imaging apparatus according to claim 16, wherein the two rod-like members are respectively formed with engaging grooves for fitting therein of lower edge portions of the first holes in the first plate member and engaging grooves for fitting therein of upper edge portions of the second holes in the second plate member.

18. A magnetic resonance imaging apparatus for generating an image of a subject in accordance with a magnetic resonance signal received after application of a magnetic field to the subject, the magnetic resonance imaging apparatus comprising:
- a magnet section configured to generate the magnetic field and to receive the magnetic resonance signal from the subject;
- a base;
- an operating portion provided in the base and performing a predetermined operation; and
- two rod-like members projecting from the base and permitting a plurality of cables to be entrained thereon in the figure of 8, one ends of the cables being connected electrically to the operating portion.

19. A magnetic resonance imaging apparatus for generating an image of a subject in accordance with a magnetic resonance signal received after application of a magnetic field to the subject, the magnetic resonance imaging apparatus comprising:
- a cradle for resting the subject thereon;
- a magnet section having an imaging space permitting the cradle to be loaded therein, the magnet section generating the magnetic field within the imaging space and capable of receiving the magnetic resonance signal from the subject;
- a base disposed in an end portion of the magnet section in a loading/unloading direction of the cradle with respect to the imaging space and capable of being conveyed separately from the magnet section;
- an operating portion provided in the base and performing a predetermined operation; and
- a plurality of cables electrically connected at one ends thereof to the operating portion, the base comprising:
- an upper structure portion constituting a part of a conveyance path which supports the cradle movably; and
- a lower structure portion supporting the upper structure portion and having a width in a direction orthogonal to the loading/unloading direction of the cradle with respect to the imaging space which width is narrower than the width of the upper structure portion,
- the lower structure portion having a first plate member and a second plate member, the first plate member and the second plate member being opposed to each other and constituting both side faces extending in the loading/unloading direction of the cradle,
- the first plate member having two first holes for insertion therein of two rod-like members respectively, the second plate member having two second holes for insertion therein of the two rod-like members respectively, the first and second holes being formed so that the two rod-like members which permit a plurality of cables to be entrained thereon can be mounted bridgewise in the first and second plate members, and
- the first holes being positioned higher than the second holes.

20. A method of conveying a magnetic resonance imaging apparatus, comprising a step of a mvoing conveying unit in a state that a plurality of cables bundled in the figure of 8 are held by means of the conveying unit constituting a part of the magnetic resonance imaging apparatus to generate an image of a subject in accordance with a magnetic resonance signal received after application of a magnetic field to the subject, and one end of the plurality of cables is connected to the conveying unit.

* * * * *